(12) United States Patent
Nasrallah et al.

(10) Patent No.: US 6,313,640 B1
(45) Date of Patent: Nov. 6, 2001

(54) SYSTEM AND METHOD FOR DIAGNOSING AND MEASURING PARTIAL DISCHARGE

(75) Inventors: Chaoukat Nabih Nasrallah, Cary; Arthur Sherman Morris, III, Raleigh, both of NC (US)

(73) Assignee: ABB Power T & D Company, Inc., Raleigh, NC (US)

( * ) Notice: Subject to any disclaimer, the term of this patent is extended or adjusted under 35 U.S.C. 154(b) by 0 days.

(21) Appl. No.: 09/018,245

(22) Filed: Feb. 3, 1998

(51) Int. Cl.$^7$ .................................................. G01R 31/06
(52) U.S. Cl. ............................ 324/536; 324/522; 324/547
(58) Field of Search .................................. 324/536, 522, 324/541, 551, 544, 557, 547, 512

(56) References Cited

U.S. PATENT DOCUMENTS

| | | | |
|---|---|---|---|
| 3,622,872 | * 11/1971 | Boaz et al. ............................ | 324/536 |
| 3,707,673 | * 12/1972 | Ccarter .................................. | 324/547 |
| 4,095,173 | * 6/1978 | Darrel .................................. | 324/535 |
| 4,191,921 | * 3/1980 | Yoshino ................................ | 324/547 |
| 4,245,187 | * 1/1981 | Wagner et al. ....................... | 324/553 |
| 4,654,806 | 3/1987 | Poyser et al. . | |
| 4,897,607 | * 1/1990 | Griinewald et al. .................. | 324/512 |
| 4,929,903 | 5/1990 | Saigo et al. . | |
| 5,117,191 | * 5/1992 | Konishi et al. ....................... | 324/424 |
| 5,159,319 | 10/1992 | Dunk et al. . | |
| 5,200,737 | * 4/1993 | Konishi et al. ....................... | 340/664 |
| 5,469,067 | * 11/1995 | Endoh et al. ......................... | 324/551 |
| 5,475,371 | 12/1995 | Dunk et al. . | |
| 5,506,511 | 4/1996 | Nilsson et al. . | |
| 5,530,364 | * 6/1996 | Mashikian et al. .................. | 324/529 |
| 5,530,366 | * 6/1996 | Nasrallah ............................. | 324/547 |
| 5,642,038 | * 6/1997 | Kim et al. ........................... | 324/76.19 |
| 5,726,575 | * 3/1998 | Poittevin et al. .................... | 324/536 |
| 5,933,012 | * 8/1999 | Bentsson et al. .................... | 324/524 |

* cited by examiner

Primary Examiner—Safet Metjahic
Assistant Examiner—Vincent Q. Nguyen
(74) Attorney, Agent, or Firm—Burns, Doane, Swecker & Mathis, LLP

(57) ABSTRACT

A method and system diagnose and measure partial discharge on-line in a power transmission system. A first wideband directional clamp-on detector detects pulses corresponding to partial discharge transmitted via a transmission line. A second wideband directional detector detects pulses corresponding to partial discharge output from at least one bushing tap of a high voltage device. The first and second pulses are nulled and then added and/or subtracted, and a diagnostic and measurement system analyzes the results to determine whether the high voltage device and/or an external source produces partial discharge, determine the type of discharge, and measure the level of discharge. For analysis of internal partial discharge, external partial discharges are rejected. The diagnostic and measurement system simultaneously analyzes multiple phases of the output of the high voltage device, while the device is energized. A method and system also diagnose and measure partial discharge off-line in a high voltage device. An output from at least one bushing tap of the high voltage device is split into AC and high frequency components which are synchrod in a diagnostic and measurement system. The diagnostic and measurement system simultaneously analyzes multiple phases of the output of the high voltage device.

20 Claims, 9 Drawing Sheets

SYSTEM AND METHOD FOR DIAGNOSING AND MEASURING PARTIAL DISCHARGE

BACKGROUND

This invention relates to a system and method for diagnosing and measuring partial discharge. More particularly, this invention relates to a system and method for diagnosing and measuring partial discharge on-line in a power transmission system and for diagnosing and measuring partial discharge off-line in a high voltage device.

Power transmission systems often suffer from partial discharges due, for example, to faults in the insulation in a high voltage device in the system, loose terminal connections, floating particles, discharges from the transmission lines, etc. These discharges typically result from an electrical stress which locally exceeds a critical value of the dielectric system within the high voltage device. The discharge is considered to be "partial" because it does not bridge the entire dielectric system, causing an undesirable power arc, but merely discharges a small volume of the dielectric system.

Though a partial discharge has a small energy content, it can cause progressive deterioration of the insulation in the high voltage device. If the discharge is continuous, eventually it will be destructive to at least the part of the dielectric system affected by the discharge. Also, the partial discharge can spread and destroy the entire high voltage device. Therefore, it is important to detect partial discharge and determine its source.

Techniques have been proposed to diagnose and measure partial discharge to prevent destruction of the high voltage device. Conventionally, partial discharge is not measured while the high voltage device is installed, i.e., in service, in the power transmission system, due to noise produced by the surrounding equipment and transmitted by the transmission line. Instead, the high voltage device is typically taken off-line, i.e., disconnected from the transmission line, and powered by a motor and generator connected through a regulating transformer.

A conventional test arrangement for measuring partial discharge is illustrated in FIG. 1. The conventional test arrangement includes a Motor 170, a High Frequency Generator Set 160, a Regulating Transformer 110, and Reactors 120. The Regulating Transformer 110 and the Reactors 120 are typically contained in a Mobile Trailer 100, and the High Frequency Generator Set 160 and the Motor 170 are typically housed in a Mobile Trailer 150. In preparation for the conventional test, a high voltage device, e.g., a Power Transformer 300, is taken off-line, i.e. the high voltage transmission line supplying power to the Power Transformer 300 is disconnected. The Power Transformer 300 is connected to the Regulating Transformer 110 via the Reactors 120 and transmission lines 180. During the test, the Power Transformer 300 is powered by the Motor 170 and the High Frequency Generator Set 160, via the Regulating Transformer 110, the Reactors 120, and the transmission lines 180. The High Frequency Generator Set 160 typically operates between approximately 240 and 400 Hz, and the Motor 170 is typically a diesel motor or a motor powered by an external power source (not shown). An output at a bushing tap of the Power Transformer 300 is detected by a Measurement System 190. The Measurement System 190 measures the level of the output, and an operator determines whether or not partial discharge is occurring at that bushing tap or terminal of the Power Transformer 300, based on the measured level.

The Measurement System 190 is typically only capable of measuring the level of an output from a bushing tap of the Power Transformer 300 during a single phase at a time. To measure the level of output during a different phase, the Measurement System 190 must be manually switched.

The conventional test arrangement depicted in FIG. 1 requires a few days and several trained operators to set up, perform measurements, and disconnect. During the time of the test, the Power Transformer 300 is unavailable for power transmission. Since a high voltage device, such as the Power Transformer 300, is a key part of an overall power transmission system, the conventional arrangement for measuring partial discharge can cause power supply interruption, particularly for large high voltage devices. In addition, the conventional arrangement requires bulky equipment. Thus, the conventional test arrangement is expensive, inefficient, and inconvenient.

There is thus a need for a method and system for diagnosing and measuring partial discharge which overcomes the drawbacks of the prior art.

SUMMARY

It is therefore an object of the invention to provide a method and system for diagnosing and measuring partial discharge on-line in a power transmission system. It is a further object of the present invention to provide a method and system for determining the type of partial discharge in a convenient and inexpensive manner. It is yet a further object of the present invention to provide a method and a system for diagnosing and measuring partial discharge off-line in a high voltage device, in an efficient manner.

According to a first embodiment, a method and system are provided for diagnosing and measuring partial discharge on-line in a power transmission system. A first detector detects pulses corresponding to partial discharge transmitted via a transmission line in the power transmission system. A second detector detects pulses corresponding to partial discharge output from at least one bushing tap of a high voltage device connected to the transmission line. The first and second pulses are added and/or subtracted, and a diagnostic and measurement system analyzes the results to determine whether or not the high voltage device and/or an external source produces partial discharge, to determine the type of such discharge, and to measure the level of the partial discharge. The diagnostic and measurement system simultaneously analyzes multiple phases of the outputs of the high voltage device, while the high voltage device is energized.

According to a second embodiment, a method and system are provided for diagnosing and measuring partial discharge off-line in a high voltage device. An output from at least one bushing tap of the high voltage device is split into AC and high frequency components. The AC component and the high frequency component are synchronized in a diagnostic and measurement system. The diagnostic and measurement system performs simultaneous analysis of multiple phases of the output of the high voltage device to determine whether the high voltage device produces partial discharge, to determine the type of partial discharge, and to measure the level of the partial discharge.

BRIEF DESCRIPTION OF THE DRAWINGS

Exemplary embodiments of the invention will now be described in more detail with reference to the accompanying drawings, in which like descriptive labels are used to refer to similar elements and in which.

DETAILED DESCRIPTION

In this description, specific details such as particular circuits, circuit components, techniques, etc., are set forth for purposes of explanation and not limitation in order to provide a thorough understanding of the invention. It will be apparent to one of ordinary skill in the art that the invention may be practiced in other embodiments that depart from these specific details. Details of well known methods, devices, and circuits are omitted so as not to obscure the description of the invention.

According to a first embodiment of the present invention, partial discharge in a power transmission system produced by sources within a high voltage device (internal partial discharge) and/or sources outside the high voltage device (external partial discharge) is diagnosed and measured, while the high voltage device is on-line.

Figure 2:
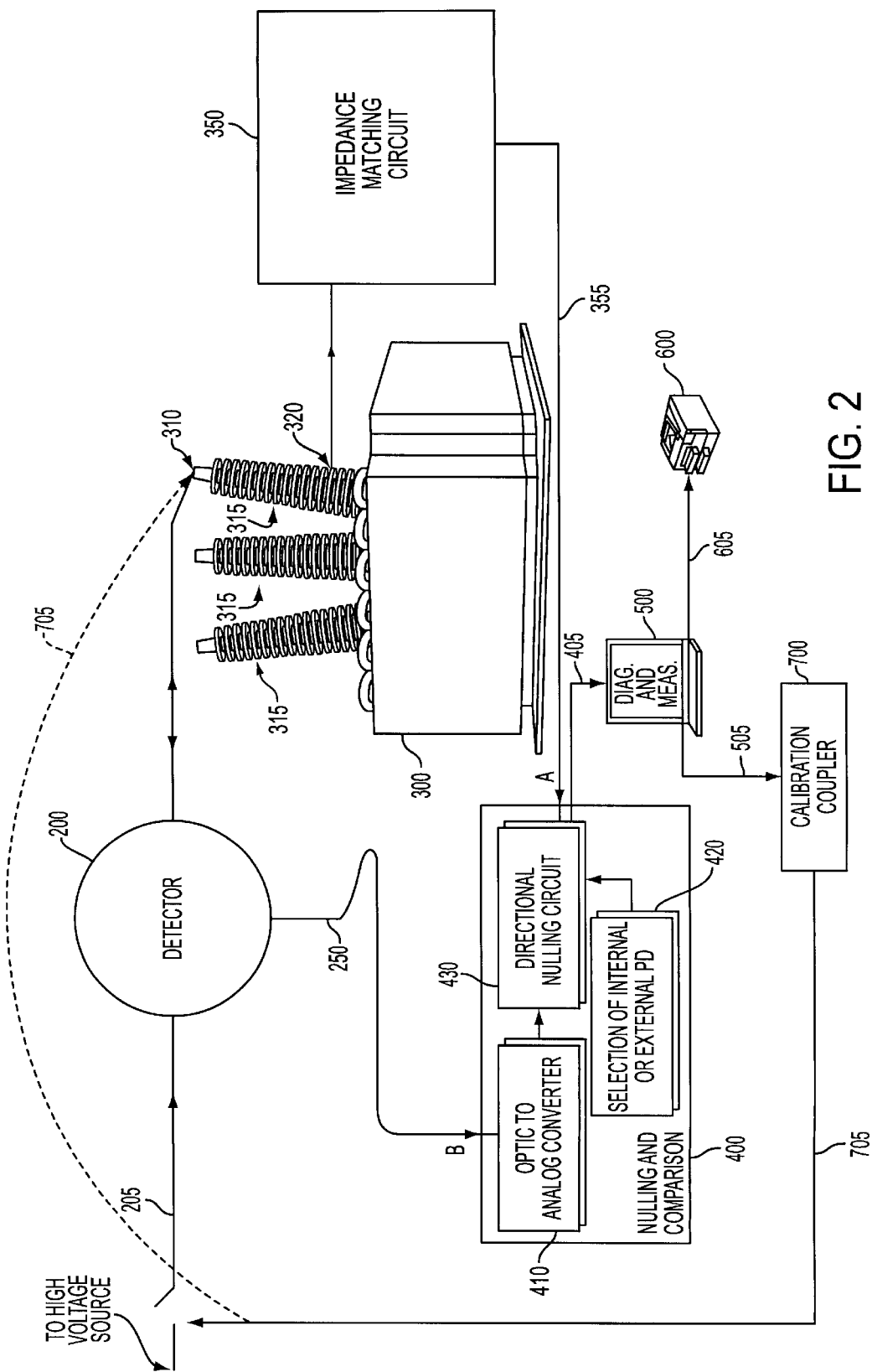
FIG. 2 illustrates an on-line partial discharge diagnostic and measurement system according to a first embodiment of the present invention.

FIG. 2 illustrates an on-line partial discharge diagnostic and measurement system according to the first embodiment of the present invention. The system includes a Detector 200 that detects pulses on a transmission line 205, e.g., a high voltage transmission line.

When the system is initially set up, the high voltage transmission line 205 is deenergized, e.g., disconnected from a high voltage source (not shown), and reference pulses are applied to the high voltage transmission line. According to an exemplary embodiment, the reference pulses are generated as a 1 Volt (V), 100 Hz square wave by a Diagnostic and Measurement Device 500. Alternately, the square wave can be generated by another device and fed to the Calibration Coupler 700. The square wave is transmitted to a Calibration Coupler 700 via a link 505 for conversion into pulses. The Calibration Coupler 700 can be implemented with capacitors and resistors for this purpose. For example, for a 1 V square wave, the Calibration Coupler 700 can include a 100 pico farad capacitor which results in a 100 pico coulomb pulse output.

The reference pulses are coupled from the Calibration Coupler 700 to the high voltage transmission line 205 via a link 705 for tuning of a Nulling and Comparison System 400. As indicated by the dashed lines, the reference pulses are also coupled to a high voltage device, e.g., a Power Transformer 300, via the link 705 for calibration of the Diagnostic and Measurement Device 500. The links 505 and 705 can be implemented in any suitable manner, e.g., with hardwired transmission lines. Tuning of the Nulling and Comparison System 400 and calibration of the Diagnostic and Measurement Device 500 are described in further detail below.

Once tuning and calibration are complete, generation of the square wave is discontinued, and the high voltage transmission line 205 is reenergized, e.g., reconnected to the high voltage power source.

The Detector 200 detects high frequency pulses corresponding to partial discharge transmitted by the high voltage transmission line 205 and converts them into pulses suitable for transmission to and use by the Nulling and Comparison Circuit 400. According to an exemplary embodiment, the Detector 200 can detect pulses over a wide range of voltages, e.g., between approximately 13.8 and 700 kilovolts (KV). The Detector 200 can be implemented with, for example, a corona ball that can be clamped onto the high voltage transmission line 205, while the line is energized. A hot stick can be used for this purpose.

The pulses are transmitted as a signal B from the Detector 200 to the Nulling and Comparison Circuit 400 via a communication link 250. The communication link 250 can be implemented with, for example, an optical fiber or a radio frequency (RF) link. In the case of an RF link, the Detector 200 can be left permanently on the high voltage transmission line 205. The communication link 250 can also be implemented in any other suitable manner, although for safety reasons a link which is insulated from the ground is preferable.

The signal B is received at the Nulling and Comparison System 400 and converted, if necessary, into an analog signal via, for example, an Optic to Analog Converter 410. Then, the signal B is delivered to a Directional Nulling Circuit 430.

The pulses on the high voltage transmission line 205 are also received by the high voltage device, e.g., the Power Transformer 300. According to a first embodiment, the Power Transformer 300 is a three-phase transformer including three bushings 315, each bushing including a high voltage terminal 310 and a bushing tap 320. For simplicity of illustration, FIG. 2 only illustrates the terminal 310 and the bushing tap 320 for one of the bushings 315. Each high voltage terminal 310 is connected to a transmission line 205 and a Detector 200. According to an exemplary embodiment, although FIG. 2 only illustrates one transmission line 205 and one Detector 200, it will be appreciated that these components are repeated for each high voltage terminal 310.

The Power Transformer 300 may also include a neutral terminal (not shown). In addition, although illustrated as a three phase power transformer, the high voltage device can also implemented with a single-phase transformer, other multiple-winding transformers, or a shunt reactor.

At each high voltage terminal 310, a voltage pulse is input from the high voltage transmission line 205. The pulse input at the terminal 310 has a voltage of, e.g., 500 KV. At the bushing tap 320, a pulse having a lower voltage, e.g. hundreds of volts, is output. Thus, each bushing 315 acts as a voltage divider. The voltage output at the bushing tap 320 depends on the capacitances of the bushing 315.

Each bushing tap is connected to an Impedance Matching Circuit 350. For simplicity of illustration, only one connection from a bushing tap 320 to the Impedance Matching Circuit 350 is shown. The Impedance Matching Circuit 350 detects high frequency pulses from each bushing tap, the pulses corresponding to partial discharge produced by the Power Transformer 300 and transferred through the Power Transformer from the high voltage transmission line 205. The Impedance Matching Circuit 350 converts the detected pulses into a form suitable for use by the Nulling and Comparison Circuit 400. The Impedance Matching Circuit 350 also compensates for the capacitances of each bushing 315.

The pulses detected by the Impedance Matching Circuit 350 are transmitted as a signal A to the Directional Nulling Circuit 430 via a link 355. For ease of implementation, a hardwired transmission line can be used as the link 355. The link 355 can also be implemented with, e.g, an RF link or an optical fiber, with suitable conversion circuitry.

For internal partial discharge analysis and measurement, the Directional Nulling Circuit 430 subtracts the signal B from the signal A, thus rejecting noise produced by surrounding equipment and transmitted by the high voltage transmission line 205. For external partial discharge analysis and measurement, the Directional Nulling Circuit 430 adds the signals A and B. A Selection Circuit 420 permits selection of internal partial discharge or external partial discharge for analysis and measurement. Alternately, both types of partial discharge can be analyzed. Depending on the selection by the Selection Circuit 420, the appropriate results of the Directional Nulling Circuit 430 are output to the Diagnostic and Measurement Device 500 via a suitable link 405, e.g., a hardwired transmission line.

During tuning of the Nulling and Comparison System 400, the signal B corresponds to the reference pulses applied to the high voltage transmission line 205 and detected by the Detector 200, and the signal A corresponds to the reference pulses transmitted through the Power Transformer 300 and detected by the Impedance Matching Circuit 350. For optimal tuning, the difference between these two signals should be nearly zero. Depending on the subtraction output of the Directional Nulling Circuit 430, the signals A and B are adjusted by adjusting the delays, filters, and gains of the Directional Nulling Circuit 430, to make the difference between these signals as close to zero as possible. This adjustment can be performed manually in response to operator input or automatically by the Diagnostic and Measurement Device 500. According to an exemplary embodiment, once tuning is completed, the delays, filter, and gains of the Directional Nulling Circuit 430 are not readjusted.

During calibration of the Diagnostic and Measurement Device 500, the reference pulses are input directly to the Power Transformer 300, by attaching the link 705 to a high voltage terminal 310. During calibration, the signal A corresponds to the reference pulse input at the terminal 310 and transferred through the Power Transformer 300, and the signal B corresponds to the low magnitude signal detected on the transmission line 205 by the Detector 200. The output of the Directional Nulling Circuit 430 is then used to set a multiplier factor in the Diagnostic and Measurement Device 500 for representing measured partial discharge levels, as described in further detail below.

Once calibration and tuning are completed, the high voltage transmission line 205 is re-energized, e.g., reconnected to the high voltage source. Then, the signal A corresponds to internal partial discharge produced by the Power Transformer 300 and external partial discharge transferred through the Power Transformer, detected and processed by the Impedance Matching Circuit 350. The signal B corresponds to external partial discharge detected by the Detector 200. Any significant difference between the signals A and B represents internal partial discharge. The sum of the signals A and B represent external partial discharge. Depending on the selection by the Selection Circuit 420, the appropriate addition or subtraction results are analyzed and measured by the Diagnostic and Measurement Device 500.

Although FIG. 2 illustrates the Selection Circuit 420 in communication with the Directional Nulling Circuit 430, it will be appreciated that the Selection Circuit 420 can select which type of partial discharge to analyze by communicating directly with the Diagnostic and Measurement Device 500. In this case, both the internal and the external partial discharge are output from the Directional Nulling Circuit 430 to the Diagnostic and Measurement Device 500.

Although the Optic to Analog Converter 410, the Selection Circuit 420, and the Directional Nulling Circuit 430 are shown in FIG. 2 as being contained in a single device 400, these components can, instead, be implemented as separate devices.

The Diagnostic and Measurement Device 500 analyzes the results output from the Directional Nulling Circuit 430 to determine whether or not the Power Transformer 300 and/or an external source produces partial discharge, to determine what type of partial discharge is produced, and to measure the level of the partial discharge. This analysis and measurement can be conveniently performed on-site, and the diagnostic and measurement results can be stored, e.g., in an internal or external memory, or output to a suitable output device such as a display monitor or a Printer 600 via a cable 605. Alternately, the data collected in the Diagnostic and Measurement Device 500 can be transmitted to another location via, e.g., a modem, for analysis, stored for future analysis and measurement, or discarded.

Figure 3:
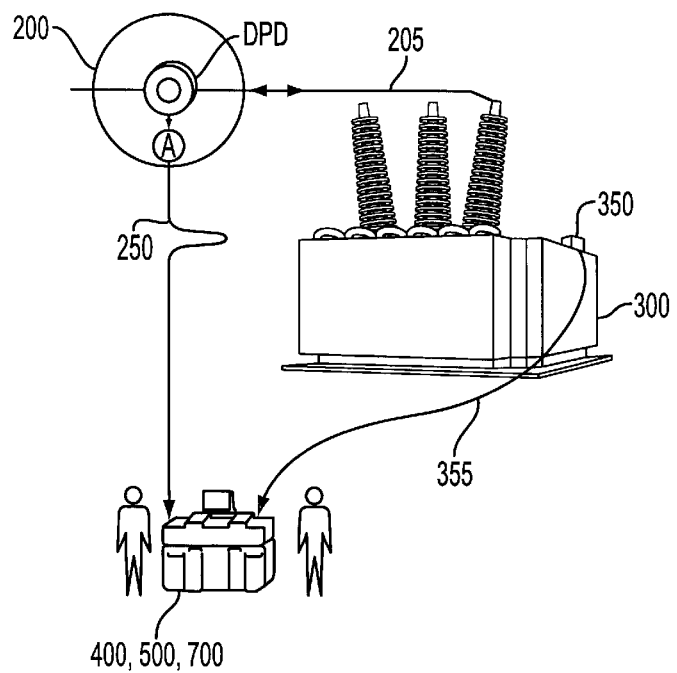
FIG. 3 illustrates an exemplary implementation of an on-line partial discharge diagnostic and measurement system according to the first embodiment of the present invention.

FIG. 3 illustrates an implementation of a system for diagnosing and measuring partial discharge according to the first embodiment of the present invention. As can be seen from FIG. 3, the Impedance Matching Circuit 350 can be attached directly to the Power Transformer 300, and the Nulling and Comparison Circuit 400, the Diagnostic and Measurement Device 500, and the Calibration Coupler 700 can be contained in a portable unit. The portable unit can be temporarily connected to the Detector 200 and the Impedance Matching Circuit 350 for the test and then disconnected after the test. This makes the on-line partial discharge diagnostic and measurement system according to the first embodiment of the present invention much simpler to operate, compared to conventional partial discharge measurement systems.

Figure 4:
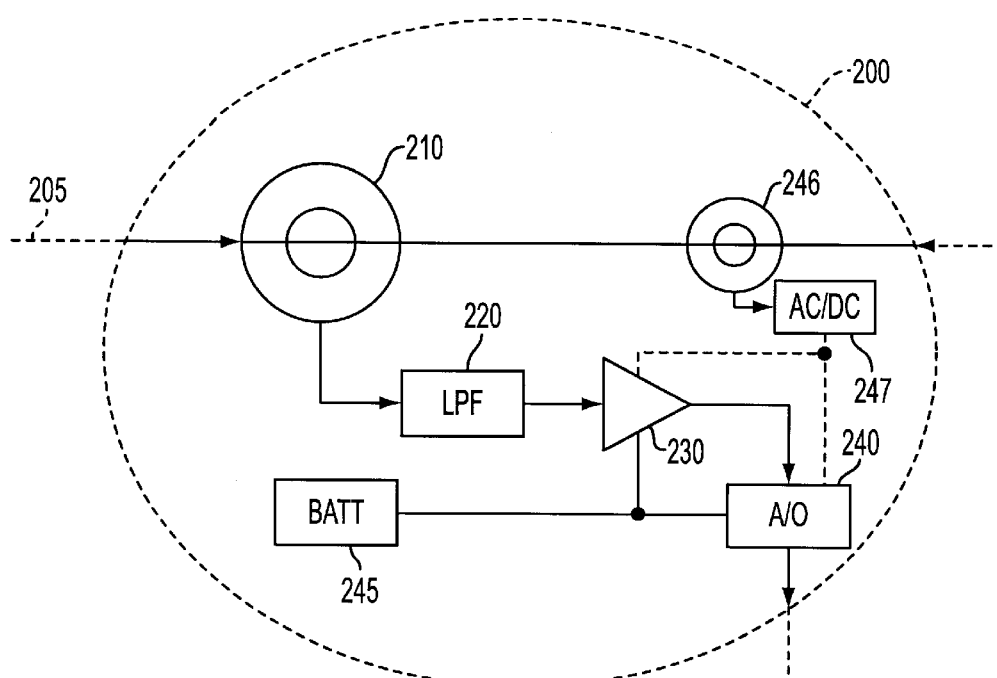
FIG. 4 illustrates a detailed diagram of a Detector according to the first embodiment of the present invention.

FIG. 4 illustrates a detailed diagram of a Detector 200 according to an exemplary embodiment of the present invention. The Detector 200 includes a directional pulse sensor, e.g., a high frequency directional current transformer (CT) 210, which detects partial discharge transmitted toward the Power Transformer 300 on the high voltage transmission line 205 as current pulses and converts them into voltage pulses. According to an exemplary embodiment, the CT 210 has a wide bandwidth, e.g., 25 Mega Hertz (MHz), enabling it to detect pulses across a large bandwidth. The CT 210 can have a current rating of up to, for example, 1200 A, without saturating the core.

The Detector 200 also includes a Lowpass Filter (LPF) 220 for filtering the detected high frequency pulses. According to an exemplary embodiment, the LPF 220 has a cutoff of approximately 10 MHz. This reduces noise and makes the bandwidth more manageable for use by the Nulling and Comparison Circuit 400. The Detector 200 further includes an Amplifier 230 with a gain of, e.g, 20 dB, for amplifying the filtered pulses and a conversion circuit, such as an Analog to Optical (A/O) Converter 240, for converting the amplified pulses into a form suitable for transmission via the communication link 250.

The Detector 200 also comprises a suitable power source, such as a rechargeable Battery 245, for energizing the electronics, e.g., the Amplifier 230 and the A/O Converter 240. Alternately, the electronics of the Detector 200 can be energized directly from the high voltage transmission line 205 via a current sensor, such as the CT 246 having a 1:1 ratio, and an AC/DC Conversion Circuit 247 as indicated by the dashed lines in FIG. 4. Both of these power sources permit the Detector 200 to be self-contained.

The voltage output from the bushing tap 320 has an AC component corresponding to the line frequency and a high frequency component corresponding to partial discharge. It is important that the high frequency component be synchronized to the AC component so that it can be determined where the partial discharge occurs, with respect to the AC signal. Conventionally, synchronization between the AC and high frequency components has been achieved by splitting the AC and high frequency components, as illustrated in FIG. 5.

Figure 5:
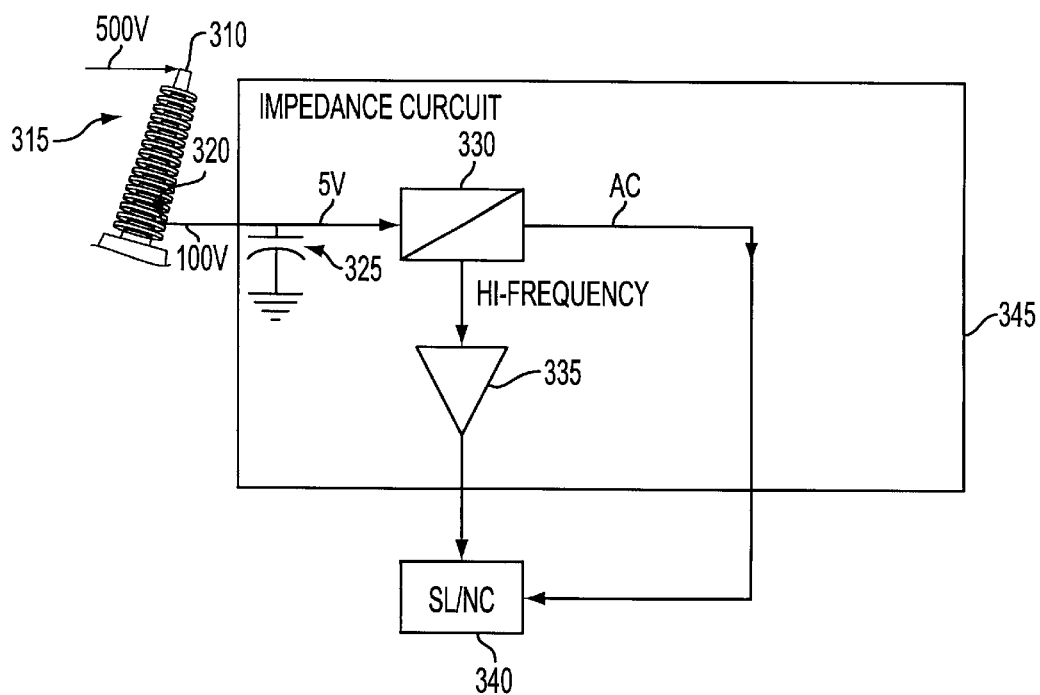
FIG. 5 illustrates a detailed diagram of a conventional synchronization arrangement.

The conventional synchronization arrangement depicted in FIG. 5 includes an Impedance Circuit 345 and a Synchronization Device 340. In the Impedance Circuit 345, the voltage pulses output at the bushing tap 320 are reduced in voltage to a smaller level, e.g., 5 V, by a capacitor 325, then split in a Splitter 330 into an AC component and a high frequency component. The high frequency component, which is typically in micro volts, is amplified in an Amplifier 335. The high frequency component and the AC component are synchronized in a Synchronization Device 340, which is typically implemented with an oscilloscope. The synchronization arrangement illustrated in FIG. 5 is used, for example, in systems such as that depicted in FIG. 1.

Figure 6:
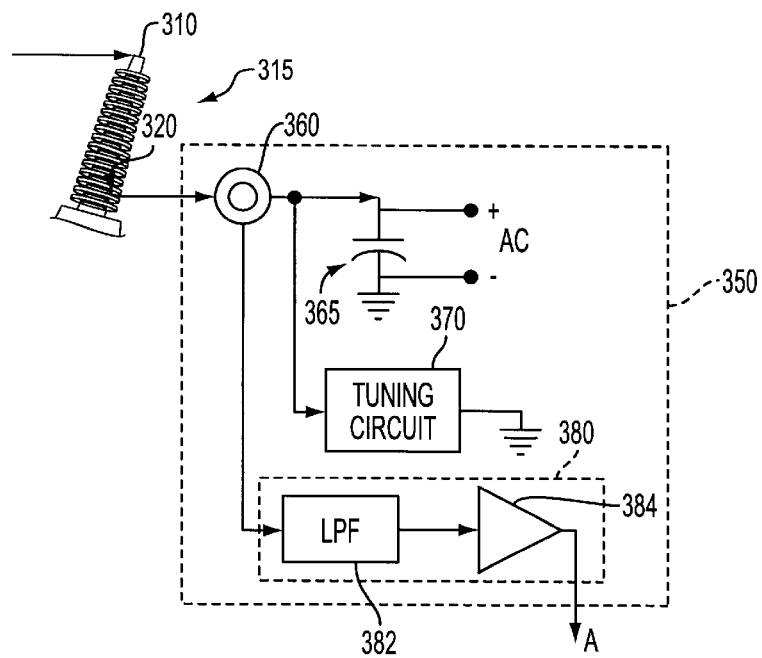
FIG. 6 illustrates a detailed diagram of an Impedance Matching Circuit according to a first embodiment of the present invention.

In contrast, according to a first embodiment of the present invention, the voltage pulses output from the Power Transformer 300 are not split into AC and high frequency components. As shown in FIG. 6, an exemplary Impedance Matching Circuit 350 according to the first embodiment of the present invention includes a directional pulse sensor, such as a high frequency directional CT 360, which detects high frequency current pulses corresponding to partial discharge and converts them into voltage pulses. For ease of implementation, the CT 360 has characteristics similar to the CT 210, e.g., a 25 MHz bandwidth. However, the CT 360 detects pulses at a lower voltage than the CT 210, due to the voltage division in the bushing 315. According to an exemplary embodiment, the CT 360 operates at 5 Volts/Amp (V/A) compared with the CT 210, which operates at 10 V/A. These sensitivities allow diagnosis and measurement of partial discharge in pico coulombs.

The Impedance Matching Circuit 350 also includes a Capacitor 365, a Tuning Circuit 370, and an Amplifier Circuit 380. The Capacitor 365 reduces the AC signal, which is passed through but not detected by the CT 360, down to a low voltage (1–10 V). The AC component is used for synchronization by the Diagnostic and Measurement Device 500, as described in detail below with reference to FIG. 9. The AC component is also delivered to the Tuning Circuit 370, which includes variable inductors and capacitors for compensating for the capacitance and inductance of the bushing 315 and the Power Transformer 300. The Amplifier Filter 380 includes a LPF 382 for lowpass filtering the detected high frequency pulses and a tunable Amplifier 384 for amplifying the lowpass filtered signal, e.g., by 20–40 dB. According to an exemplary embodiment, the LPF 382 has the same cut-off frequency as the LPF 220, e.g. 10 MHz. Although not shown, the electronics of the Impedance Matching Circuit 350, e.g., the Amplifier 384, can be powered, e.g., by the Diagnostic and Measurement Device 500, a battery, or directly from the Power Transformer 300. The amplified signal is output as a signal A to the Nulling and Comparison Circuit 400.

For simplicity of illustration, only the components of the Impedance Matching Circuit 350 for processing the output from one bushing tap 320 are shown in FIG. 6. It will be appreciated that these components are repeated for each bushing tap of the Power Transformer 300.

Figure 7:
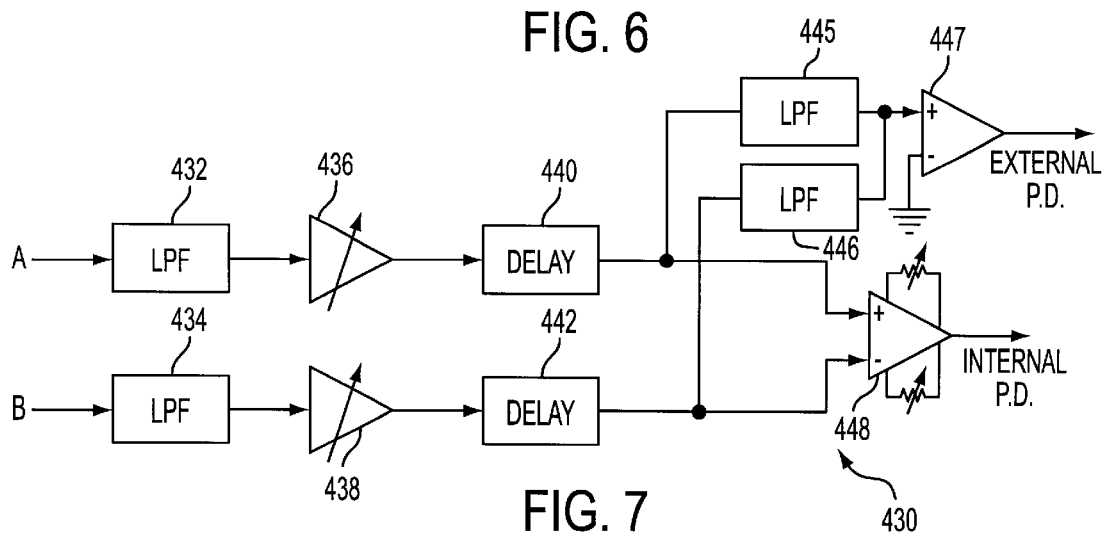
FIG. 7 illustrates a detailed diagram of a Directional Nulling Circuit according to the first embodiment of the present invention.

FIG. 7 illustrates a detailed block diagram of a Directional Nulling Circuit 430 according to an exemplary embodiment of the present invention. For simplicity of illustration, FIG. 7 illustrates the components of the Directional Nulling Circuit 430 for only one bushing tap of the Power Transformer 300. It will be appreciated that the components of the Directional Nulling Circuit 430 are repeated for each bushing tap of the Power Transformer 300.

As shown in FIG. 7, the Directional Nulling Circuit 430 comprises LPFs 432 and 434 which lowpass filter the signals A and B, respectively. According to an exemplary embodiment, the LPFs 432 and 434 are implemented with multiple-pole filters, e.g., eight pole programmable filters, to reduce ringing caused by the large bandwidth of the signals A and B. The bandwidth of the LPFs 432 and 434 can be set to suit system standards, e.g., 70–300 KHz for the American National Standards Institute (ANSI) standard and 100–500 KHz for the European International Electrotechnical Commission (EC) standard. The bandwidth can be set to suit any other standards, e.g., the ASTM standard.

The Directional Nulling Circuit 430 also includes tunable Amplifiers 436 and 438 which amplify the lowpass filtered signals A and B, respectively. The Amplifiers 436 and 438 amplify the signals A and B so that their amplitudes match. The gains of the Amplifiers 436 and 438 can be adjusted as necessary during tuning to provide the appropriate amount of amplification.

The signals A and B differ in phase, due to the different delays caused by the processing applied to these signals. Thus, the Directional Nulling Circuit 430 also includes Delay Elements 440 and 442 which delay the amplified signals A and B, respectively, so that the signals are in-phase with one another. The delays of the Delay Elements 440 and 442 are adjusted as necessary during tuning to provide the appropriate amount of delay for each signal. According to any exemplary embodiment, the Delay Elements 440 and 442 can be adjusted in nanoseconds. Although two Delay Elements 440 and 442 are shown in FIG. 7, it should be appreciated that the Delay Elements 440 and 442 can be replaced with a single delay element, on either single path, to achieve the same result.

For external partial discharge, the Directional Nulling Circuit 430 further comprises programmable LPFs 445 and 446 and a Summation Amplifier 447. According to an exemplary embodiment, the LPFs 445 and 446 are implemented with eight pole programmable filters. For analysis of external partial discharge, the filtered signal A is added to the filtered signal B in the Summation Amplifier 447. The result is output to the Diagnostic and Measurement Device 500.

The LPFs 432, 434, 445, and 446 can be implemented with any conventional digital or analog filters having the appropriate bandwidths.

For internal partial discharge, the Directional Nulling Circuit 430 further includes a Differential Amplifier 448 which subtracts the signal B from the signal A. As indicated in FIG. 7, the gain of each signal path of the Differential Amplifier 448 is tunable, as necessary, so that the amplitude of the signal A matches the amplitude of the signal B.

Figure 8:
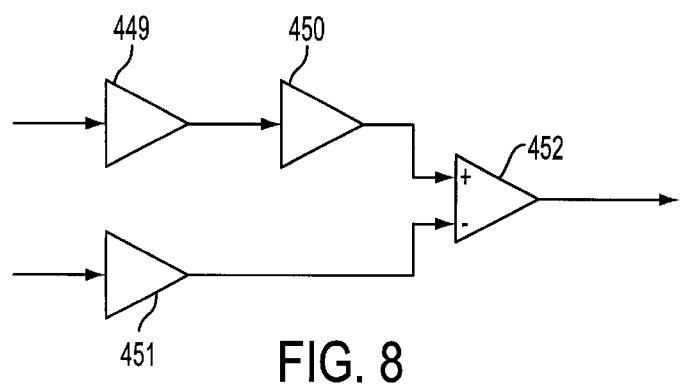
FIG. 8 illustrates a detailed diagram of a Differential Amplifier according to the first embodiment of the present invention.

The Differential Amplifier 448 can be implemented with, for example, a conventional op-amp or a non-symmetric amplifier such as that depicted in FIG. 8. According to this embodiment, the Differential Amplifier 448 includes Amplifiers 449 and 450 for amplifying the signal A and an Amplifier 451 for amplifying the signal B. The amplified signals are subtracted in the op-amp 452, and the result is output to the Diagnostic and Measurement Device 500.

The output of the Directional Nulling Circuit 430 is analyzed by the Diagnostic and Measurement Device 500. During tuning of the Nulling and Comparison System 400, the Diagnostic and Measurement Device 500 analyzes the output of the Differential Amplifier 448 to determine if it is close to zero. If the output is not close to zero, the signals A and B are adjusted by adjusting the gains, delays, and bandwidths of the filters of the Directional Nulling Circuit 430. An external oscilloscope can be used for this purpose, or the adjustment can be automatically performed. Adjustment is repeated until the difference between the signals A and B is approximately zero.

During calibration of the Diagnostic and Measurement Device 500, when the reference pulses are input into the high voltage terminal 310, the Diagnostic and Measurement Device 500 uses the difference between the signals A and B to set a multiplication factor for representing levels of partial discharge.

Once the tuning and calibration are complete, and the transmission line 205 is energized, the signals output from the Directional Nulling Circuit 430 are pulses which are output to the Diagnostic and Measurement Device 500 to determine if the Power Transformer 300 and/or external sources produce partial discharge, to determine the type of partial discharge, and to measure the level of partial discharge.

Figure 9:
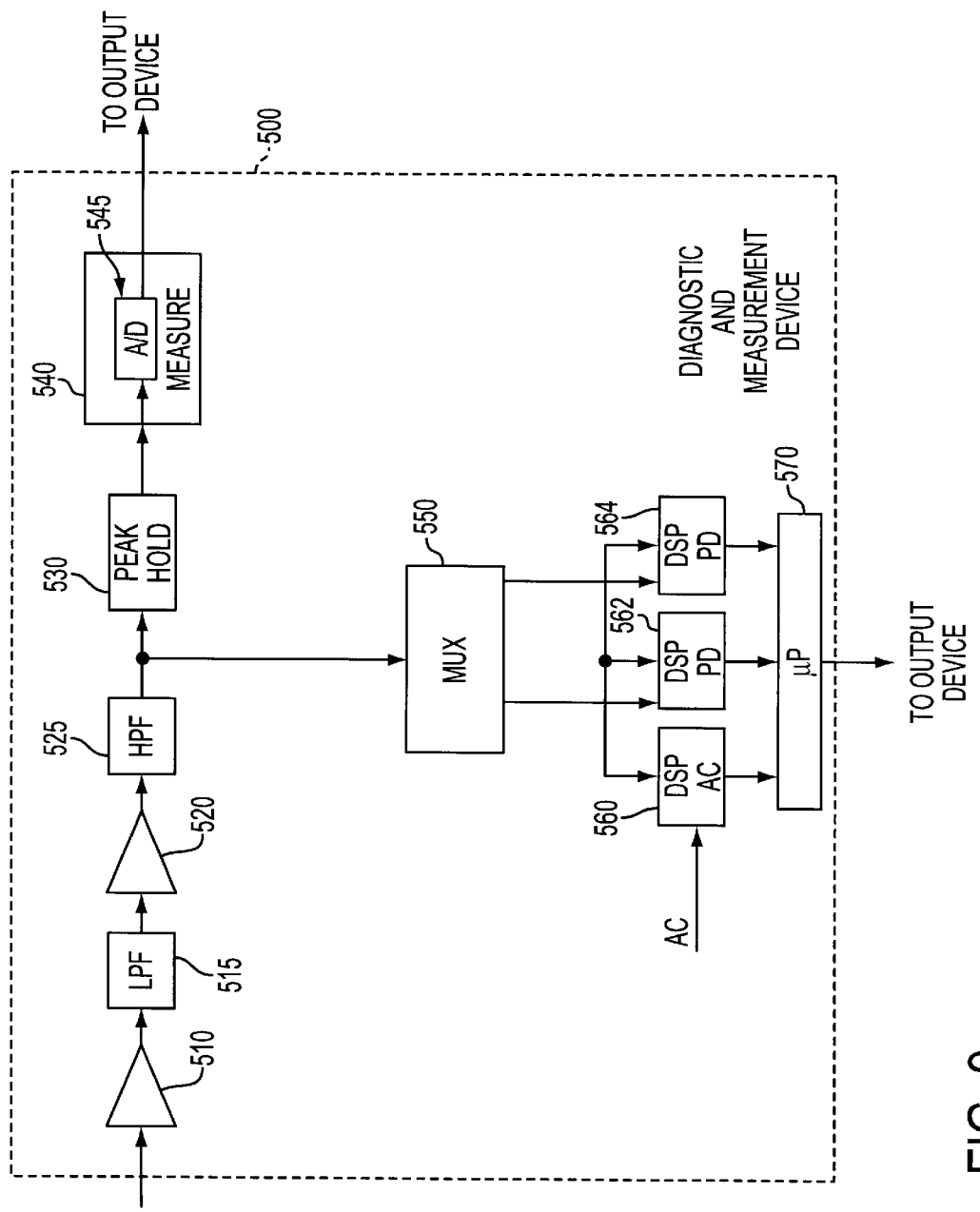
FIG. 9 illustrates an exemplary Diagnostic and Measurement Device according to the present invention.

FIG. 9 illustrates a detailed diagram of a Diagnostic and Measurement Device according to an exemplary embodiment of the present invention. The Diagnostic and Measurement Device 500 includes an Amplifier 510 for amplifying the pulses output from the Directional Nulling Circuit 430, a LPF 520 for lowpass filtering the amplified pulses, another Amplifier 520 for amplifying the lowpass filtered pulses, and a highpass filter (HPF) 525 for highpass filtering the amplified pulses. The peaks of the amplified and bandpass filtered pulses are detected by a Peak Hold Circuit 530, and the levels of the peaks are measured and converted into a digital form in a Measuring Circuit 540. The Measuring Circuit 540 includes an A/D Converter 545 which outputs a digital signal representing the level of partial discharge measured according to a multiplication factor which is set during calibration. The multiplication factor compensates for the effects of processing of the detected partial discharge which may affect the level of the partial discharge actually detected by the Peak Hold Circuit 530. For example, for a reference 1 V square wave filtered through a 100 pico farad capacitor to produce a 100 pico coulomb reference pulse, the multiplication factor is adjusted as necessary so that the measured level is 100 pico coulombs. The measured levels are output, e.g., to an output device such as a Printer 600.

Although FIG. 9 shows only one signal path, it will be appreciated that the Diagnostic and Measurement Device 500 processes a number of signals corresponding to the number of phases of the output from the Power Transformer 300. The Amplifier 510, the LPF 515, the Amplifier 520, the HPF 525, the Peak Hold Circuit 530, and the Measuring Circuit 540 are repeated for each phase.

The bandpass filtered pulses resulting from filtering in the LPF 515 and HPF 525 are also input into a Multiplexer (MUX) 550 for selecting multiple phases of the outputs of the Power Transformer 300 to be analyzed. According to the first embodiment, the MUX 550 selects two phases of the bushing tap outputs for analysis by the Digital Signal Processors (DSPs) 562 and 564. The MUX 550 can make this selection automatically, either randomly or in response to an operator designation. Depending on the phases selected, the MUX 550 outputs the corresponding pulses to the DSPs 562 and 564. In this manner, partial discharge can be analyzed simultaneously for multiple phases. It will be appreciated that fewer or more than two phases can be selected for simultaneous analysis.

According to an exemplary embodiment the DSPs 562 and 564 each include a high speed (10 MHz) A/D Converter for converting the selected analog information into a digital signal and for analyzing the amplitude of the digital signal. The sample rate of each A/D Converter can adjusted, as desired, so that the pulses are sampled at regular intervals. For example, the sample timing can be set so that samples are collected every 60 seconds for 16.66 millisecond durations.

A DSP 560 receives the AC component from the Impedance Matching Circuit 35 and converts it into a digital signal. The digital signal from the DSP 560 is delivered to, e.g., a microprocessor 570, along with the digital signals from the DSPs 562 and 564. The microprocessor 570 synchronizes the digital signals from the DSPs 562 and 564 with the digital signal from the DSP 560, so that the partial discharge analyzed in the DSPs 562 and 564 are in phase with the AC signal.

The microprocessor 570 produces information about the amplitudes of the partial discharges and about the positions of the partial discharges in relation to the AC signal. This information can be output to a device, such as the Printer 600, for analysis/reference and/or used by the microprocessor 570 to automatically determine whether or not partial discharge occurs and to determine the type of partial discharge.

Figure 10A:
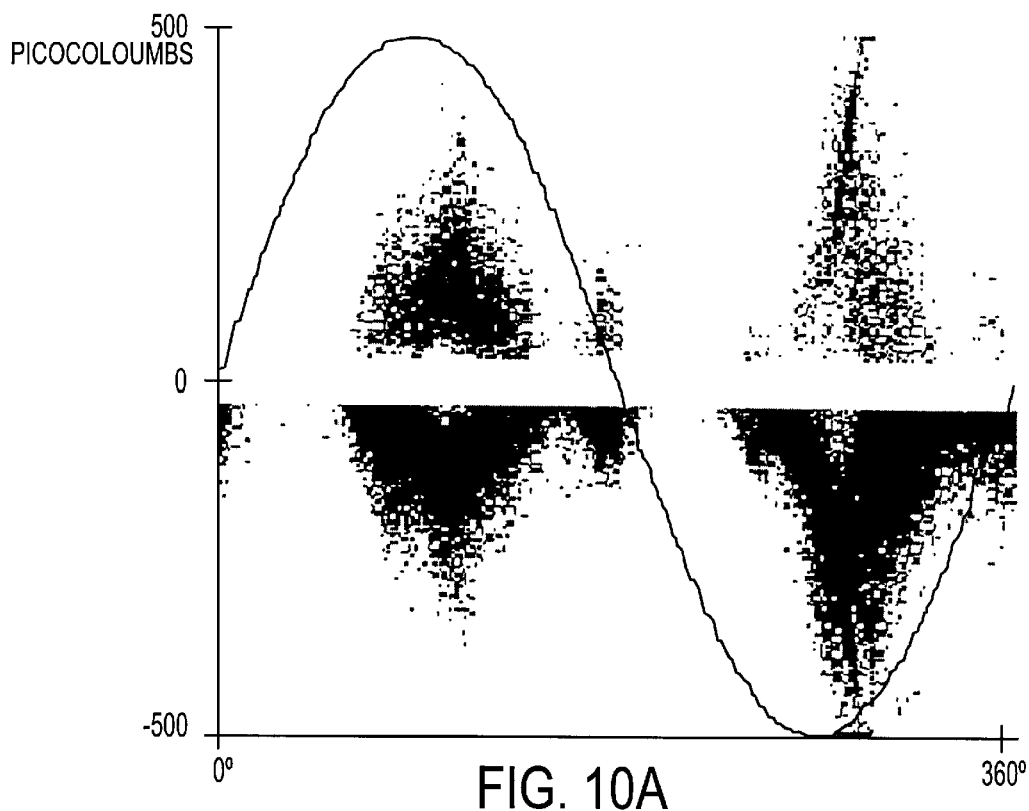
FIGS. 10A and 10B illustrate exemplary results of the Diagnostic and Measurement Device according to an exemplary embodiment of the present invention.
Figure 10B:
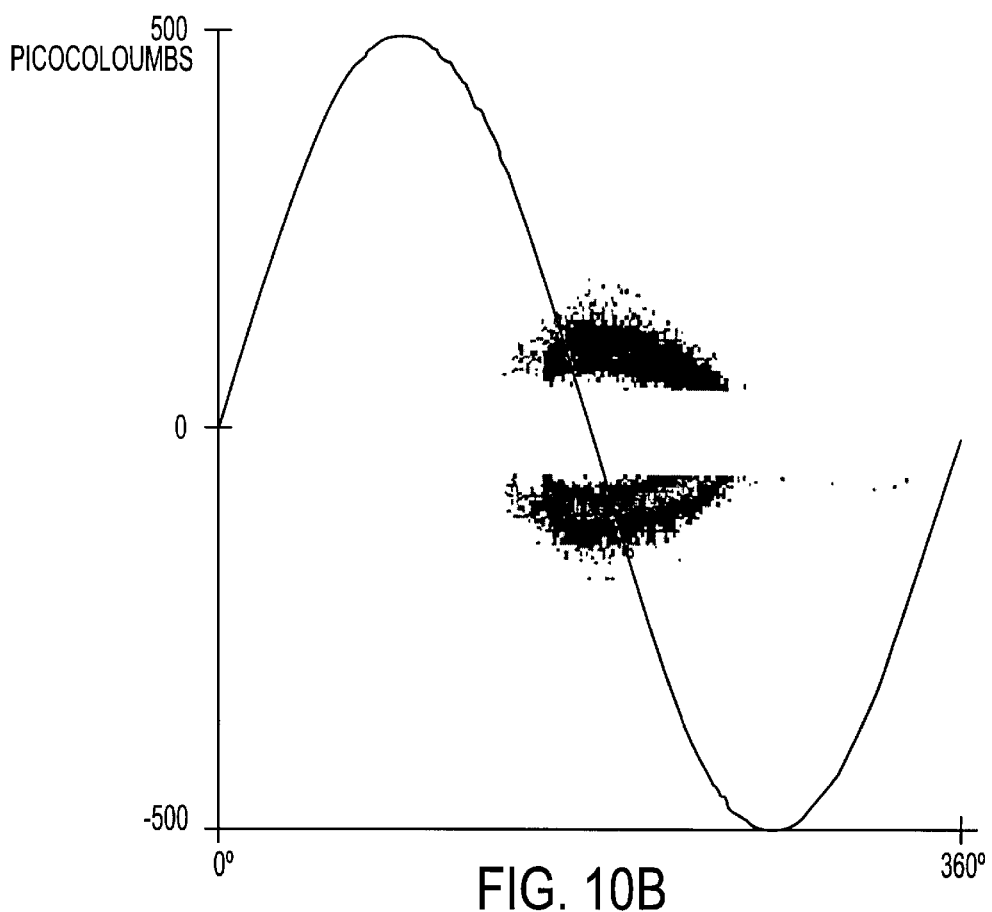

FIGS. 10A and 10B illustrate results produced by the Diagnostic and Measurement Device 500 according to an exemplary embodiment of the present invention. These figures represent diagnostic results output, e.g., to a computer monitor. In both figures, the results are plotted from 0° to 360° phase on the horizontal axis and from −500 to 500 pico coulombs amplitude on the vertical axis. It will be appreciated that these figures are merely examples, and the amplitude and phase scales can be adjusted, as desired. The line frequency represented in these figures is approximately 60 Hz. The invention is also applicable to other line frequencies, e.g., 50 Hz.

Partial discharges are indicated in FIGS. 10A–10B as the shaded areas, the sine wave representing the AC signal and shown in each figure as a reference. The darker the shading in these figures, the higher the intensity of the partial discharge. The location of the partial discharge with respect to the sine wave provides information about the type of the partial discharge. For example, FIG. 10A shows that a partial discharge occurs due to arcing, because the partial discharge occurs at the zero crossing of the sine wave. FIG. 10B indicates a partial discharge due to an internal source within the Power Transformer 300, e.g., insulation faults. Using results such as those depicted in FIGS. 10A–10B, an operator can determine the type of a partial discharge. Alternately, this determination can be performed automatically by, e.g., a microcomputer.

Figure 11:
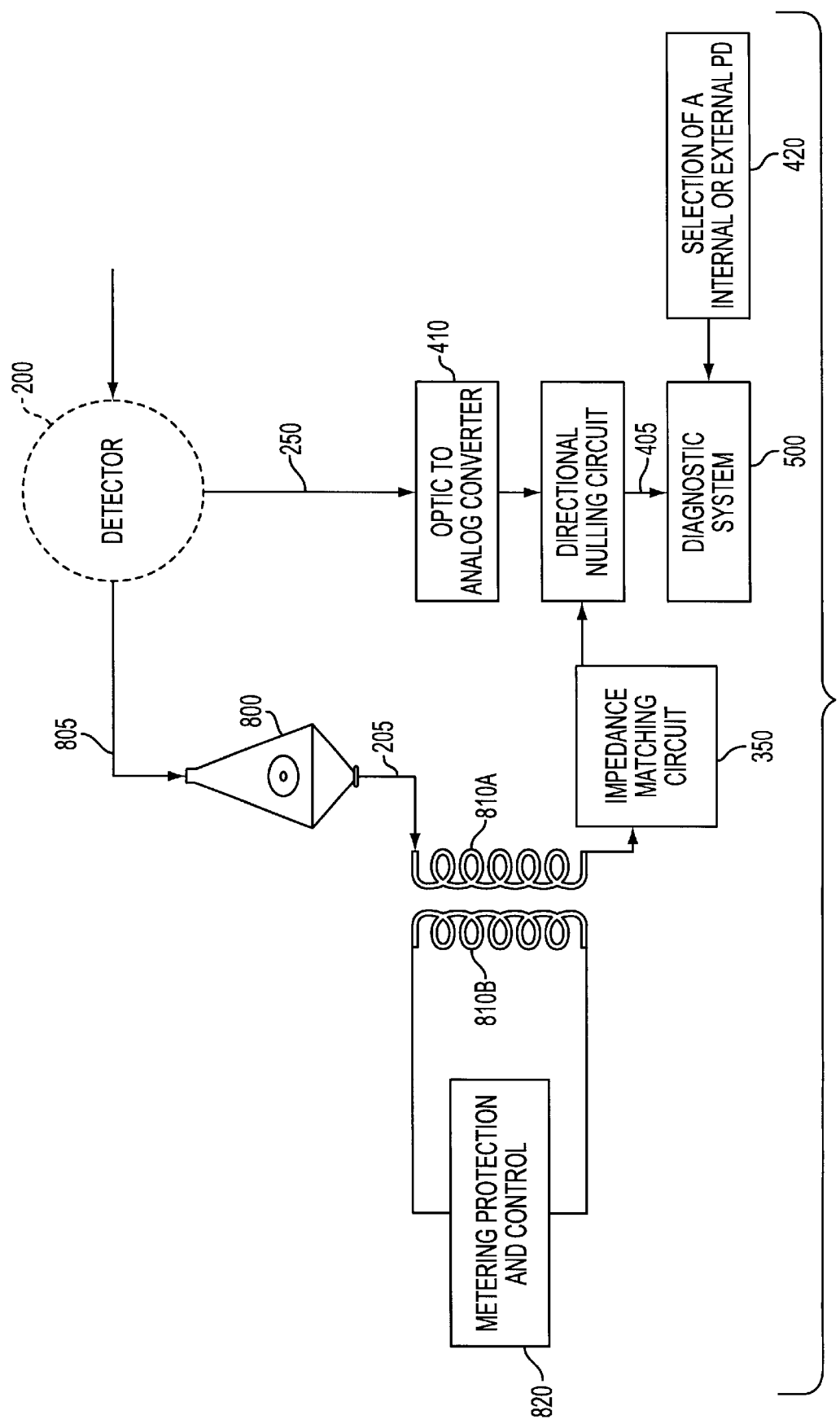
FIG. 11 illustrates an alternate partial discharge diagnostic and measurement system according to the first embodiment of the present invention.

Although described above with reference to diagnosis and measurement of partial discharge in a power transmission system comprising a three phase power transformer, the invention can be applied to diagnose partial discharge in other systems. For example, FIG. 11 illustrates an exemplary system for diagnosing and measuring partial discharge in an instrument transformer system including a single-phase transformer 800 connected to a high voltage transmission line 805 and windings 810A and 810B. The winding 810B is connected to a conventional Metering Protection and Control Circuit 820. In addition, the invention can be applied to other types of power systems, e.g. shunt reactor systems and multiple-winding systems. The implementation of these systems, including the calibration and tuning, is similar to that described above with reference to FIG. 2, the main difference being the number of bushings.

Figure 12:
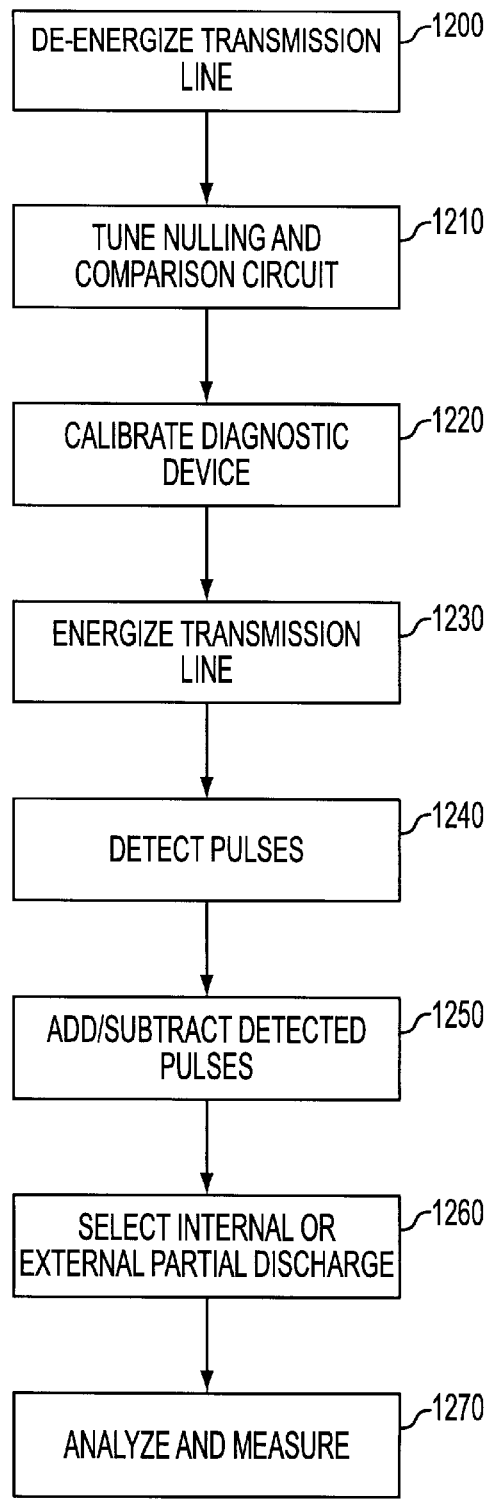
FIG. 12 illustrates a method for diagnosing and measuring partial discharge according to the first embodiment of the present invention.

FIG. 12 illustrates a method for diagnosing and measuring partial discharge according to a first embodiment the present invention. The method begins at step 1200, at which the high voltage transmission line 205 is deenergized, e.g., disconnected from the high voltage source. At step 1210, the Nulling and Comparison Circuit 400 is tuned. At step 1220, the Diagnostic and Measurement Device 500 is calibrated. After calibration and tuning are completed, the high voltage transmission line 205 is reenergized at step 1230. Next, at step 1240, pulses corresponding to partial discharge are detected by the Detector 200 and by the Impedance Matching Circuit 350 and converted into a form suitable for use by the Nulling and Comparison System 400. At step 1250, the pulses output from the Detector 200 and the Impedance Matching Circuit 350 are added and/or subtracted. At step 1260, the internal partial discharge and/or the external partial discharge is selected for measurement and analysis. If no selection is made, the default is the internal partial discharge. Depending on the selection, either or both of the addition results and the subtraction results are analyzed and measured at step 1270 to determine whether or not the high voltage device and/or an external source produces a partial discharge, to determine the type of the partial discharge, and to measure the level of the partial discharge.

The first embodiment described above applies to diagnosis and measurement of partial discharge in a power transmission system, while the high voltage device is on-line, i.e., while the high voltage device is installed or in service.

According to a second embodiment, partial discharge can be diagnosed and measured before the high voltage device is installed, e.g., during quality testing in a factory.

Figure 13:
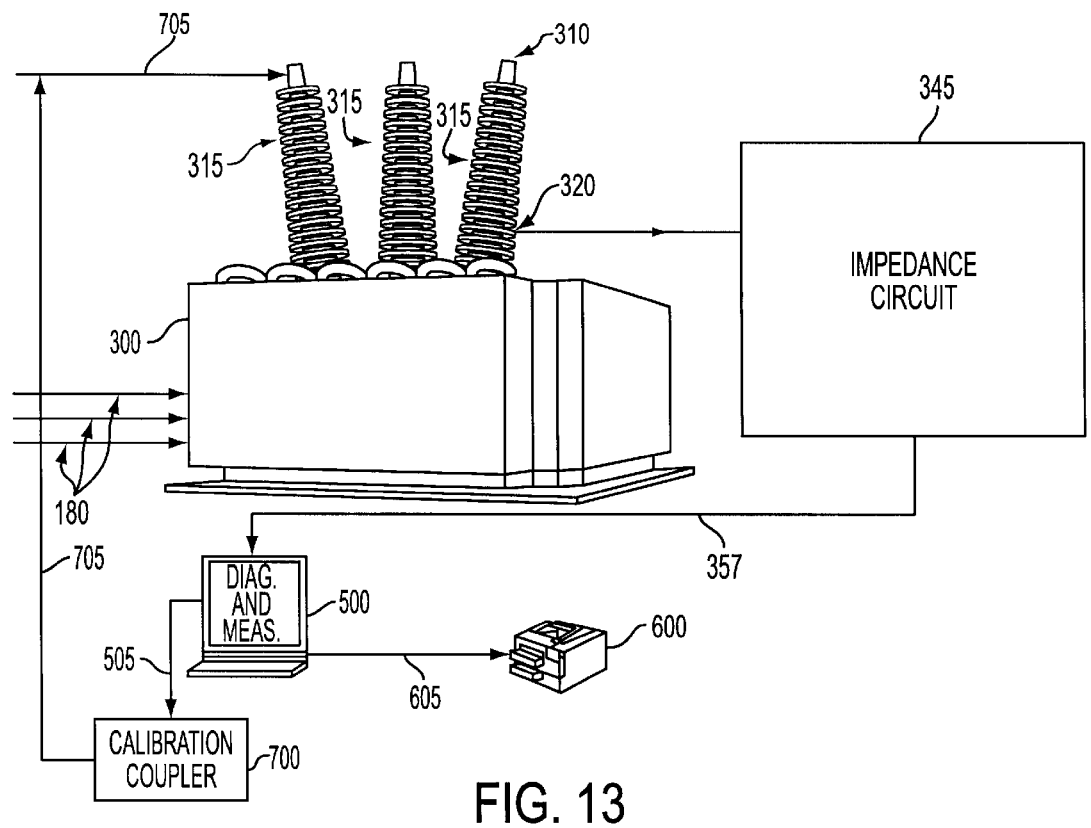
FIG. 13 illustrates a partial discharge diagnostic and measurement system according to a second embodiment of the present invention.

FIG. 13 illustrates an exemplary system for diagnosing and measuring partial discharge off-line according to a second embodiment of the present invention. According to the second embodiment, the partial discharge diagnostic and measuring system includes an Impedance Circuit 345, such as that shown in FIG. 5, and the Diagnostic and Measurement Device 500. The Diagnostic and Measurement Device 500 is calibrated in the same manner described above, e.g., by generating reference pulses with the aid of a Calibration Coupler 700, and applying the reference pulses to the input line 705 connected to a high voltage terminal of a high voltage device, e.g., the Power Transformer 300. As in FIG. 3, the Detection Device 500 and the Calibration Coupler 700 can be contained in a portable device.

Figure 1:
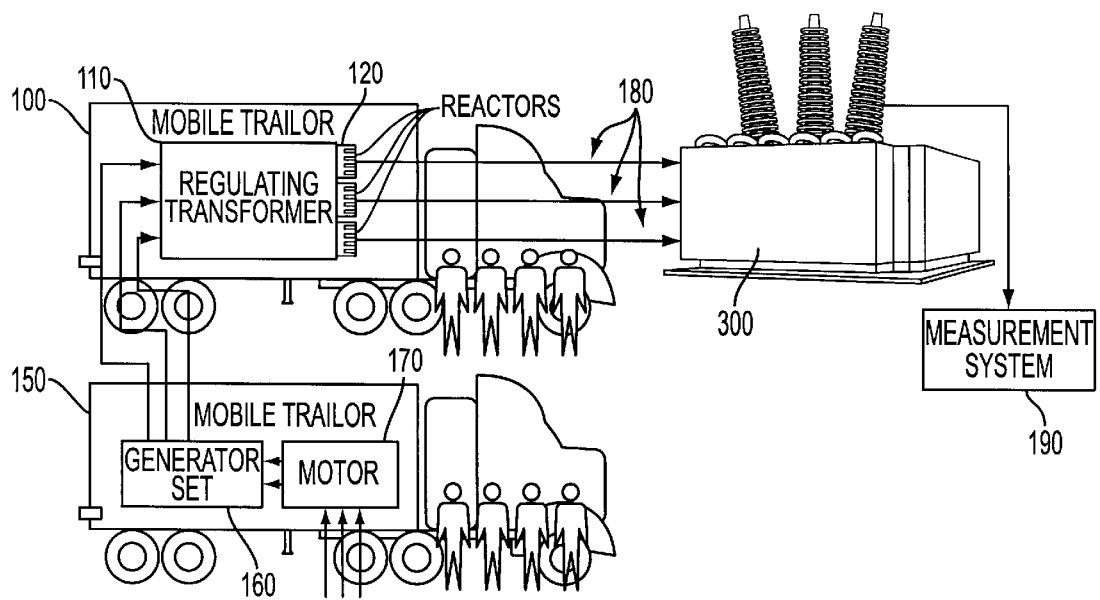
FIG. 1 illustrates a conventional partial discharge detection system.

Once calibration is completed, the Power Transformer 300 is energized from a voltage source via lines 180, e.g., as shown in FIG. 1. The bushing taps of the Power Transformer 300 are connected to the Impedance Circuit 345 which splits the output from each bushing tap into AC and high frequency components as described above with reference to FIG. 5. The AC and high frequency components are delivered to the Diagnostic and Measurement Device 500 via a link 357, e.g., a hard-wired link. The Diagnostic and Measurement Device 500 synchronizes the AC component to the high frequency component as described above with reference to FIG. 9. The Diagnostic and Measurement Device 500 also analyses and measures the high frequency component, which represents partial discharge produced by the Power Transformer 300. The Diagnostic and Measurement Device 500 simultaneously analyzes multiple phases of the outputs of the Power Transformer 300 and delivers the results to an output device such as a Printer 600 via a cable 605, as described above.

Although particularly convenient for use before a high voltage device is installed, the system according to the second embodiment is also useful for diagnosis and measurement of partial discharge for high voltage devices which are already installed. In this case, the high voltage device is disconnected from the high voltage transmission line and connected to a power supply, such as the Motor 170 and the High Frequency Generator Set 160 depicted in FIG. 1. Though this requires that the high voltage device be taken off-line, the Diagnostic and Measurement Device 500 is capable of simultaneously analyzing and measuring the levels of multiple phases of the high output voltage device, which is an improvement over the prior art.

Although not shown, it will be appreciated that the system of FIG. 13 can also be used for other types of high voltage devices, e.g., an Instrument Transformer, such as that shown in FIG. 11. It will further be appreciated that the Impedance Matching Circuit 350 can also be used in the off-channel partial discharge diagnostic and measurement system according to the second embodiment, instead of the Impedance Circuit 345. Alternately, the Tuning Circuit 370 can be added to the Impedance Circuit 345.

Figure 14:
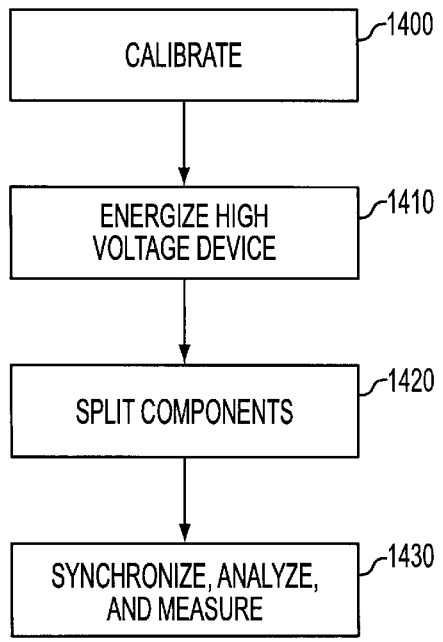
FIG. 14 illustrates a method for diagnosing and measuring partial discharge according to the second embodiment of the present invention.

FIG. 14 illustrates an exemplary method for diagnosing and measuring partial discharge according to the second embodiment. The method begins at step 1400, at which the Diagnostic and Measurement Device 500 is calibrated. After calibration is completed, the Power Transformer 300 is energized at step 1410, e.g., by connecting it to the Motor 170, the High Frequency Generator Set 160, the Regulating Transformer 110, and the Reactors 120, or another suitable power source via the transmission lines 180. Next, at step 1420, the output of the high voltage device, e.g., the Power Transformer 300, is split into AC and high frequency components, both of which are delivered to the Diagnostic and Measurement Device 500. At step 1430, the AC and high frequency components are synchronized, and the high frequency components are analyzed and measured to determine whether or not the Power Transformer 300 produces partial discharge, to determine the type of the partial discharge produced, and to measure the level of the partial discharge.

According to the present invention, a method and system are provided for diagnosing partial discharge on-line in a power transmission system and off-line in a high voltage device, e.g., during quality testing. This permits partial discharge to be diagnosed quickly with minimal training and labor. The invention is applicable to load and no load conditions, i.e., when a current and a voltage are applied to a high voltage device and when only a voltage is applied to the high voltage device, respectively.

It will be understood that the invention is not limited to the particular embodiments that are described and illustrated above. For example, one skilled in the art will appreciate that the invention can be applied to power transmission systems including multiple-winding transformers, shunt reactors, etc. The specification contemplates any and all modifications that fall within the scope of the invention as defined by the following claims.

What is claimed is:

1. A system for on-line diagnosis and measurement of partial discharge in a power transmission system, the system comprising:
    a first detector for detecting pulses corresponding to partial discharge transmitted by a transmission line in the power transmission system;
    a second detector for detecting pulses corresponding to partial discharge output from at least one terminal of a high voltage device connected to the transmission line;
    a circuit for adding and subtracting the first detected pulses and the second detected pulses; and
    a diagnostic device for analyzing and measuring at least one of the addition and subtraction results to determine whether or not at least one of the high voltage device and an external source produces partial discharge, while the high voltage device is energized.

2. The system of claim 1, wherein the diagnostic device determines the type of partial discharge and measures the level of partial discharge.

3. The system of claim 1, further comprising a selection circuit for selecting whether to analyze internal partial discharge produced by the high voltage device or external partial discharge, wherein if the selection circuits internal partial discharge, the diagnostic device analyzes the subtraction result, and if the selection circuit selects external partial discharge, the diagnostic device analyzes the addition result.

4. The system of claim 1, wherein the diagnostic device simultaneously analyzes multiple phases of the output from the high voltage device.

5. The system of claim 1, wherein the detector has a bandwidth of approximately 25 MHz.

6. The system of claim 1, further comprising a calibration coupler, wherein the calibration coupler couples a reference pulse to the transmission line, and the addition/subtraction circuit is tuned so that the subtraction result is approximately zero.

7. The system of claim 1, wherein at least one of the high voltage device is a single winding power transformer, a multiple winding power transformer, an instrument transformer, and a shunt reactor.

8. A method for on-line diagnosis and measurement of partial discharge in a power transmission system, the method comprising the steps of:
    detecting pulses corresponding to partial discharge transmitted by a transmission line in the power transmission system;
    detected pulses corresponding to partial discharge output from at least one terminal of a high voltage device connected to the transmission line;
    adding and subtracting the detected pulses; and
    analyzing and measuring at least one of the addition and subtraction results to determine whether or not at least one of the high voltage device and an external source produces partial discharge, while the high voltage device is energized.

9. The method of claim 8, wherein the analyzing step analyzes the type of partial discharge and measures the level of partial discharge.

10. The system of claim 8, further comprising a step of selecting whether to analyze internal partial discharge produced by the high voltage device or external partial discharge, wherein if the selection step selects internal partial discharge, the analysis step analyses the subtraction result, and if the selection step selects external partial discharge, the analysis step analyzes the addition result.

11. The method of claim 8, wherein the analyzing step includes simultaneously analyzing multiple phases of the output from the high voltage device.

12. The method of claim 8, wherein the step of detecting detects pulses over a 25 MHz bandwidth.

13. The method of claim 8, further comprising a tuning step, wherein reference pulses are applied to the transmission line, and addition/subtraction circuitry is adjusted so that the subtraction result is nearly zero.

14. The method of claim 8, wherein at least one of the high voltage device is a single winding power transformer, a multiple winding power transformer, an instrument transformer, and a shunt reactor.

15. A system for off-line diagnosis and measurement of partial discharge in a high voltage device, comprising:
    an off-line power source for supplying power to the high voltage device; and
    a diagnostic and measurement device for analyzing outputs of the high voltage device to determine whether the high voltage device produces partial discharge, wherein the diagnostic and measurement device simultaneously analyzes and measures multiple phases of outputs of the high voltage device.

16. The system of claim 15, further comprising a circuit for splitting the outputs of the high voltage device into AC and high frequency components, wherein the diagnostic and measurement device synchronizes the high frequency components to the AC components and analyzes and measures the high frequency components.

17. The system of claim 15, wherein the high voltage device is a single winding power transformer, a multiple winding power transformer, an instrument transformer, or a shunt reactor.

18. A method for off-line diagnosis and measurement of partial discharge in a high voltage device, comprising the steps of:
    supplying power to the high voltage device from an off-line power source; and analyzing and measuring outputs of the high voltage device to determine whether the high voltage device produces partial discharge, wherein the step of analyzing and measuring simultaneously analyzes and measures multiple phases of the outputs of the high voltage device.

19. The method of claim 17, further comprising the step of splitting the outputs of the high voltage device into AC and high frequency components, wherein the analysis step includes synchronizing the high frequency components to the AC components and analyzing and measuring the high frequency components.

20. The method of claim 17, wherein the high voltage device is a single winding power transformer, a multiple winding power transformer, an instrument transformer, or a shunt reactor.

* * * * *